(12) United States Patent
Trusov et al.

(10) Patent No.: US 10,291,265 B2
(45) Date of Patent: May 14, 2019

(54) ACCELERATED GALOIS FIELD CODING FOR STORAGE SYSTEMS

(71) Applicant: EMC Corporation, Hopkinton, MA (US)

(72) Inventors: Maxim Trusov, Saint Petersburg (RU); Mikhail Danilov, Saint Petersburg (RU); Ivan Tchoub, Saint Petersburg (RU); Sergey Karpenkov, Vsevolozhsk (RU); Sergey Koyushev, Saint Petersburg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 15/193,409

(22) Filed: Jun. 27, 2016

(65) Prior Publication Data

US 2017/0187398 A1 Jun. 29, 2017

(30) Foreign Application Priority Data

Dec. 25, 2015 (RU) .............................. 2015155763

(51) Int. Cl.
*H03M 13/00* (2006.01)
*G06F 11/10* (2006.01)
*H03M 13/15* (2006.01)

(52) U.S. Cl.
CPC ..... *H03M 13/6516* (2013.01); *G06F 11/1076* (2013.01); *H03M 13/151* (2013.01); *H03M 13/154* (2013.01)

(58) Field of Classification Search
CPC ............ H03M 13/6516; H03M 13/154; G06F 3/0619; G06F 3/064; G06F 11/1076
See application file for complete search history.

(56) References Cited

U.S. PATENT DOCUMENTS

| | | | |
|---|---|---|---|
| 6,070,003 A | 5/2000 | Gove et al. | |
| 6,550,035 B1 * | 4/2003 | Okita | H03M 13/15 714/774 |
| 7,549,110 B2 * | 6/2009 | Stek | G11B 20/1833 714/758 |
| 7,559,007 B1 * | 7/2009 | Wilkie | H03M 13/1515 714/790 |
| 7,581,156 B2 * | 8/2009 | Manasse | H03M 13/1515 714/781 |
| 8,458,515 B1 | 6/2013 | Saeed | |
| 8,532,212 B2 | 9/2013 | Ito | |
| 8,683,296 B2 * | 3/2014 | Anderson | H03M 13/373 714/6.24 |
| 8,683,300 B2 * | 3/2014 | Stek | G11B 20/1833 714/776 |
| 8,762,642 B2 | 6/2014 | Bates et al. | |
| 8,914,706 B2 * | 12/2014 | Anderson | G06F 11/1076 714/6.24 |

(Continued)

OTHER PUBLICATIONS

U.S. Appl. No. 15/620,892, filed Jun. 13, 2017, Danilov et al.

(Continued)

*Primary Examiner* — Esaw T Abraham
(74) *Attorney, Agent, or Firm* — Daly, Crowley Mofford & Durkee, LLP (57) ABSTRACT

A technique to accelerate Galois Field (GF) arithmetic. The technique, which does not rely on any specific processor instruction set, can be used to accelerate erasure coding within storage systems.

12 Claims, 8 Drawing Sheets

(56) References Cited

U.S. PATENT DOCUMENTS

| | | | |
|---|---|---|---|
| 9,053,114 | B1 | 6/2015 | Lerner et al. |
| 2005/0038968 | A1 | 2/2005 | Iwamura et al. |
| 2006/0105724 | A1 | 5/2006 | Nakao |
| 2006/0147219 | A1 | 7/2006 | Yoshino et al. |
| 2007/0177739 | A1 | 8/2007 | Ganguly et al. |
| 2008/0126357 | A1 | 5/2008 | Casanova et al. |
| 2009/0112953 | A1 | 4/2009 | Barsness et al. |
| 2010/0091842 | A1 | 4/2010 | Ikeda et al. |
| 2010/0180176 | A1 | 7/2010 | Yosoku et al. |
| 2010/0246663 | A1 | 9/2010 | Citta et al. |
| 2011/0053639 | A1 | 3/2011 | Etienne Suanez et al. |
| 2011/0055494 | A1 | 3/2011 | Roberts et al. |
| 2012/0051208 | A1 | 3/2012 | Li et al. |
| 2012/0106595 | A1 | 5/2012 | Bhattad et al. |
| 2013/0067187 | A1 | 3/2013 | Moss et al. |
| 2014/0046997 | A1 | 2/2014 | Dain et al. |
| 2014/0047040 | A1 | 2/2014 | Patiejunas et al. |
| 2016/0239384 | A1 | 8/2016 | Slik et al. |
| 2017/0046127 | A1 | 2/2017 | Fletcher et al. |

OTHER PUBLICATIONS

U.S. Appl. No. 15/620,897, filed Jun. 13, 2017, Danilov et al.
U.S. Appl. No. 15/620,898, filed Jun. 13, 2017, Danilov et al.
U.S. Appl. No. 15/620,900, filed Jun. 13, 2017, Danilov et al.
U.S. Appl. No. 15/281,172, filed Sep. 30, 2016, Trusov et al.
U.S. Appl. No. 15/398,832, filed Jan. 5, 2017, Danilov et al.
U.S. Appl. No. 15/398,826, filed Jan. 5, 2017, Danilov et al.
U.S. Appl. No. 15/398,819, filed Jan. 5, 2017, Danilov et al.
Anvin, "The Mathematics of RAID-6;" First Version Jan. 20, 2004; Last Updated Dec. 20, 2011; Retrieved from https://www.kernel.org/pub/linux/kernel/people/hpa/raid6.pdf; 9 Pages.
Blömer et al., "An XOR-Based Erasure-Resilient Coding Scheme;" Article from CiteSeer; Oct. 1999; 19 Pages.
U.S. Appl. No. 14/929,788, filed Nov. 2, 2015, Kurilov et al.
U.S. Appl. No. 15/083,324, filed Mar. 29, 2016, Danilov et al.
U.S. Appl. No. 15/193,144, filed Jun. 27, 2016, Kurilov et al.
U.S. Appl. No. 15/193,141, filed Jun. 27, 2016, Danilov et al.
U.S. Appl. No. 15/186,576, filed Jun. 20, 2016, Malygin et al.
U.S. Appl. No. 15/193,145, filed Jun. 27, 2016, Fomin et al.
U.S. Appl. No. 15/193,407, filed Jun. 27, 2016, Danilov et al.
U.S. Appl. No. 15/193,142, filed Jun. 27, 2016, Danilov et al.
U.S. Non-Final Office Action dated Oct. 5, 2017 for U.S. Appl. No. 15/193,407; 14 pages.
U.S. Non-Final Office Action dated Oct. 18, 2017 for U.S. Appl. No. 15/193,145; 21 pages.
Office Action dated Nov. 27, 2017 from U.S. Appl. No. 15/186,576; 11 Pages.
Office Action dated Dec. 14, 2017 from U.S. Appl. No. 15/281,172; 9 Pages.
Response to Office Action dated Oct. 5, 2017 from U.S. Appl. No. 15/193,407, filed Dec. 20, 2017; 12 Pages.
Response to Office Action dated Oct. 18, 2017 from U.S. Appl. No. 15/193,145, filed Jan. 17, 2018; 12 Pages.
U.S. Non-Final Office Action dated Feb. 2, 2018 for U.S. Appl. No. 15/398,826; 16 Pages.
U.S. Non-Final Office Action dated May 10, 2018 for U.S. Appl. No. 15/193,407; 13 Pages.
Response to U.S. Non-Final Office Action dated May 10, 2018 for U.S. Appl. No. 15/193,407; Response filed Jun. 28, 2018; 11 Pages.
Notice of Allowance dated Oct. 9, 218 for U.S. Appl. No. 15/193,407; 9 Pages.

\* cited by examiner

| | 00000001 | 00000010 | 00000011 | ... | 11111111 |
|---|---|---|---|---|---|
| 0001 | $p_1$ | $p_2$ | $p_3$ | | $p_{256}$ |
| 0010 | $p_{257}$ | $p_{258}$ | $p_{259}$ | | $p_{512}$ |
| 0011 | $p_{513}$ | $p_{514}$ | $p_{515}$ | | $p_{768}$ |
| ⋮ | | | | ⋱ | |
| 1111 | $p_{3841}$ | $p_{3842}$ | $p_{3843}$ | | $p_{4096}$ |

ACCELERATED GALOIS FIELD CODING FOR STORAGE SYSTEMS

CROSS REFERENCE TO RELATED APPLICATIONS

This application claims priority to Russian Application Number 2015155763, filed on Dec. 25, 2015, and entitled "ACCELERATED GALOIS FIELD CODING FOR STORAGE SYSTEMS," which is incorporated herein by reference in its entirety.

BACKGROUND

As is known in the art, distributed storage systems may provide a wide range of storage services, while achieving high scalability, availability, and serviceability. An example of a distributed storage system is Elastic Cloud Storage (ECS) from EMC Corporation of Hopkinton, Mass.

As is also known in the art, erasure coding is a coding technique that was originally created as a forward error correction method for binary erasure channels. More recently, erasure coding has been used for data storage protection, including within some distributed storage systems.

Although erasure coding implementations may utilize relatively simple arithmetic operations, the number of such operations required may be proportional to the size of the data being encoded. Thus, existing erasure coding implementations may be perceived as unacceptably slow in terms of processing time and/or elapsed time.

SUMMARY

Described herein is a technique to accelerate Galois Field (GF) arithmetic. In some embodiments, the technique does not rely on any specific processor instruction set. In certain embodiments, the technique can be used to accelerate erasure coding or other coding with a storage system, such as Elastic Cloud Storage (ECS).

According to one aspect of the disclosure, a method is provided for use with a storage system comprising a plurality of storage devices. The method may include: retrieving a single-element multiplication matrix for a Galois field (GF); generating a multi-element multiplication matrix for the GF using the single-element multiplication matrix; receiving a request to store data; encoding the data using the multi-element multiplication matrix; and storing portions of the encoded data within the storage devices. In some embodiments, the method further includes storing the multi-element multiplication matrix to non-volatile memory.

In various embodiments, encoding the data using the multi-element multiplication matrix comprises encoding the data using an erasure code. The method may further include: dividing the data into a plurality of data fragments arranged as a column vector; retrieving a coding matrix having elements in the Galois field; and calculating the dot product of ones of the data fragments and rows of the coding matrix using the multi-element multiplication matrix to generate a plurality of coded fragments.

In some embodiments, the storage system comprises a plurality of storage nodes each having locally attached storage devices. The method may further include: storing the plurality of data fragments within local storage devices of at least two of the plurality of storage nodes; and storing the plurality of coded fragments within local storage devices of at least two of the plurality of storage nodes.

According to one aspect of the disclosure, a storage system includes a plurality of storage devices and a processor. The processor may be configured to: retrieve a single-element multiplication matrix for a Galois field (GF); generate a multi-element multiplication matrix for the GF using the single-element multiplication matrix; receive a request to store data; encode the data using the multi-element multiplication matrix; and store portions of the encoded data within the storage devices. The storage system may further include a non-volatile memory and the processor may be configured to store the multi-element multiplication matrix thereto.

In some embodiments, the processor is configured to encode the data using an erasure code. The processor may be further configured to: divide the data into a plurality of data fragments arranged as a column vector; retrieve a coding matrix having elements in the Galois field; and calculate the dot product of ones of the data fragments and rows of the coding matrix using the multi-element multiplication matrix to generate a plurality of coded fragments.

In various embodiments, the storage system includes a plurality of storage nodes each having locally attached storage devices and a processor. Each of the storage nodes may be configured as described above and further configured to: store the plurality of data fragments within local storage devices of at least two of the plurality of storage nodes; and store the plurality of coded fragments within local storage devices of at least two of the plurality of storage nodes.

In some embodiments of the method and/or storage system, the Galois field includes $2^4$ elements and the single-element multiplication matrix is a 16×16 matrix. In certain embodiments, the multiple-element multiplication matrix is a 16×256 matrix.

BRIEF DESCRIPTION OF THE DRAWINGS

The concepts, structures, and techniques sought to be protected herein may be more fully understood from the following detailed description of the drawings, in which.

The drawings are not necessarily to scale, or inclusive of all elements of a system, emphasis instead generally being placed upon illustrating the concepts, structures, and techniques sought to be protected herein.

DETAILED DESCRIPTION

Before describing embodiments of the structures and techniques sought to be protected herein, some terms are explained. As used herein, the phrases "computer," "computing system," "computing environment," "processing platform," "data memory and storage system," and "data memory and storage system environment" are intended to be broadly construed so as to encompass, for example, private or public cloud computing or storage systems, or parts thereof, as well as other types of systems comprising distributed virtual infrastructure and those not comprising virtual infrastructure. The terms "application," "program," "application program," and "computer application program" herein refer to any type of software application, including desktop applications, server applications, database applications, and mobile applications.

As used herein, the term "storage device" refers to any non-volatile memory (NVM) device, including hard disk drives (HDDs), flash devices (e.g., NAND flash devices), and next generation NVM devices, any of which can be accessed locally and/or remotely (e.g., via a storage attached network (SAN)). The term "storage device" can also refer to a storage array comprising one or more storage devices.

Figure 1:
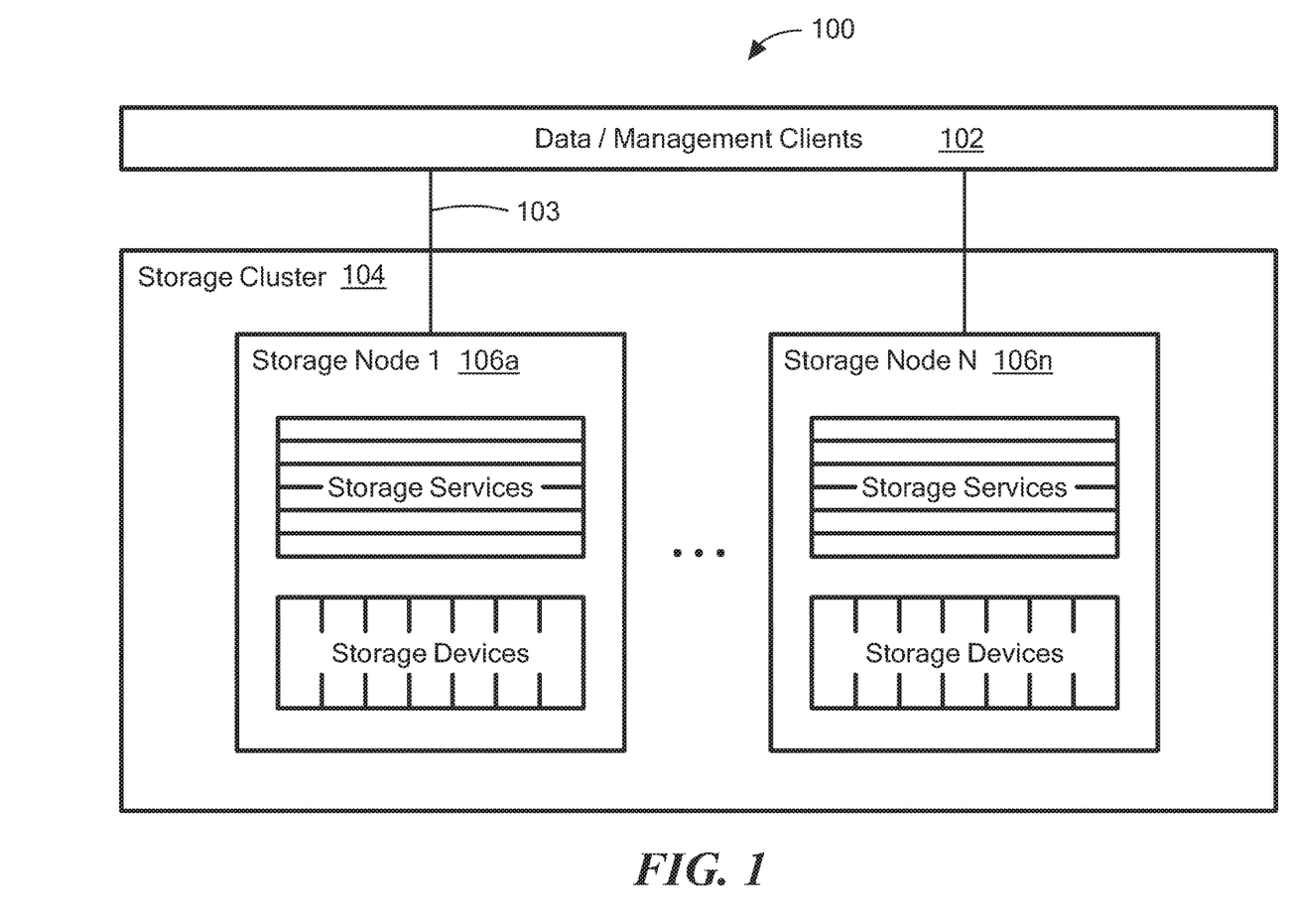
FIG. 1 is a block diagram of an illustrative distributed storage system, in accordance with an embodiment of the disclosure.
Figure 1A:
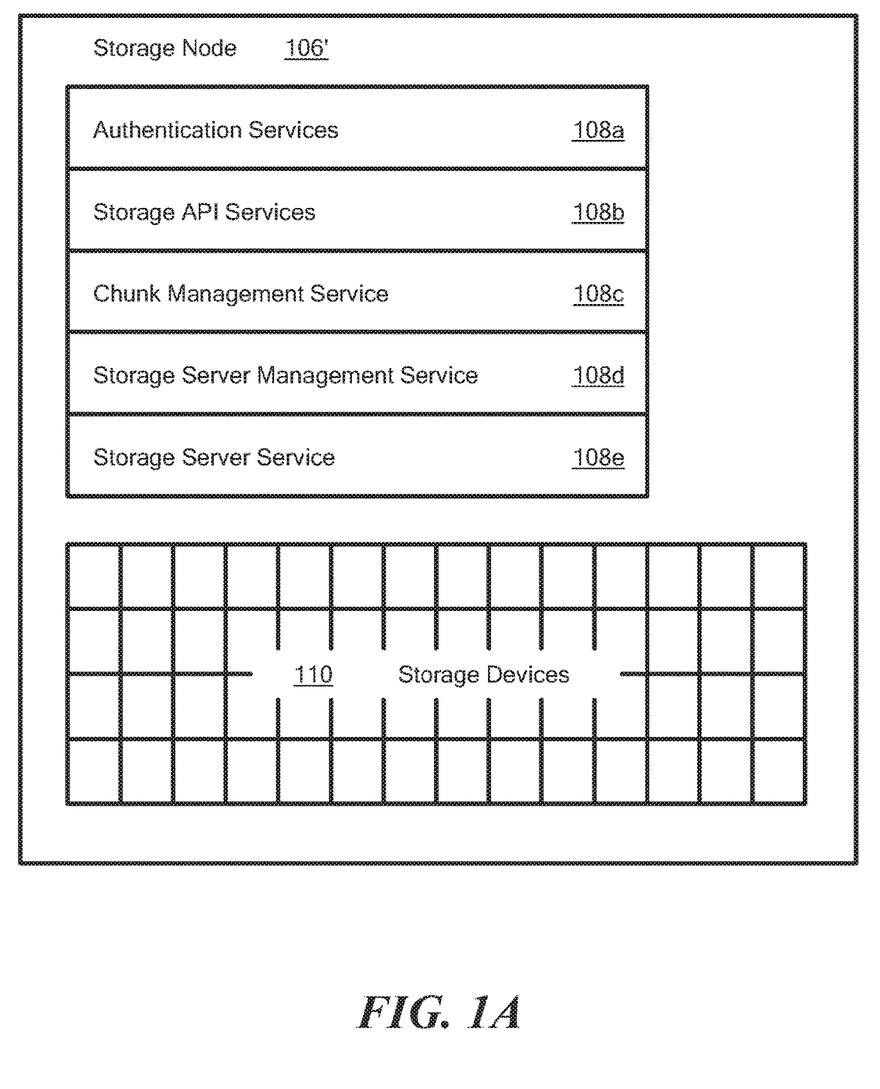
FIG. 1A is a block diagram of an illustrative storage node which may form a part of the distributed storage system of FIG. 1, in accordance with an embodiment of the disclosure.

FIG. 1 shows a distributed storage system, in accordance with an embodiment of the disclosure. An illustrative distributed storage system 100 includes one or more clients 102 in communication with a storage cluster 104 via a network 103. The network 103 may include any suitable type of communication network or combination thereof, including networks using protocols such as Ethernet, Internet Small Computer System Interface (iSCSI), Fibre Channel (FC), and/or wireless protocols. The clients 102 may include user applications, application servers, data management tools, and/or testing systems. The storage cluster 104 includes one or more storage nodes 106a ... 106n (generally denoted 106). An illustrative storage node is shown in FIG. 1A and described below in conjunction therewith.

In general operation, clients 102 issue requests to the storage cluster 104 to read and write data. Write requests may include requests to store new data and requests to update previously stored data. Data read and write requests include an ID value to uniquely identify the data within the storage cluster 104. A client request may be received by any available storage node 106. The receiving node 106 may process the request locally and/or may delegate request processing to one or more peer nodes 106. For example, if a client issues a data read request, the receiving node may delegate/proxy the request to peer node where the data resides. In various embodiments, the cluster 104 uses accelerated erasure coding to protect data stored therein, as described below in conjunction with FIGS. 2-5.

In various embodiments, the distributed storage system 100 comprises an object storage system, wherein data is read and written in the form of objects, which are uniquely identified by object IDs. In some embodiments, the storage cluster 104 utilizes Elastic Cloud Storage (ECS) from EMC Corporation of Hopkinton, Mass.

In some embodiments, the system 100 employs a flat cluster architecture whereby cluster-level services are distributed evenly among the nodes. To implement cluster-level services using a flat cluster architecture, processing may be coordinated and shared among several nodes using the concept of object ownership. An object stored within the system 100, including system objects and user data, may be owned by a single node 106 at any given time. When a node owns an object, it may be solely responsible for handling updates to the object or for performing other processing associated with the object. Notably, a given node may own an object (e.g., user data) without having a copy of that object's data stored locally (i.e., the object data can be stored on one or more remote nodes).

FIG. 1A shows a storage node, in accordance with an embodiment of the disclosure. A storage node 106' may be the same as or similar to a storage node 106 in FIG. 1. The illustrative storage node 106' includes one or more services 108 and one or more storage devices 110, as shown. A storage node 106' may include a processor (not shown) configured to execute instructions provided by services 108.

In the example shown, a storage node 106' includes the following services: an authentication service 108a to authenticate requests from clients 102; storage API services 108b to parse and interpret requests from clients 102; a storage chunk management service 108c to facilitate storage chunk allocation/reclamation for different storage system needs and monitor storage chunk health and usage; a storage server management service 108d to manage available storage devices capacity and to track storage devices states; and a storage server service 108e to interface with the storage devices 110.

A storage device 110 may comprise one or more physical and/or logical storage devices attached to the storage node 106a. A storage node 106 may utilize VNX, Symmetrix VMAX, and/or Full Automated Storage Tiering (FAST), which are available from EMC Corporation of Hopkinton, Mass. While vendor-specific terminology may be used to facilitate understanding, it is understood that the concepts, techniques, and structures sought to be protected herein are not limited to use with any specific commercial products. In various embodiments, the storage node 106' uses accelerated erasure coding to protect data stored within storage devices 110, as described below in conjunction with FIGS. 2-5.

Figure 2:
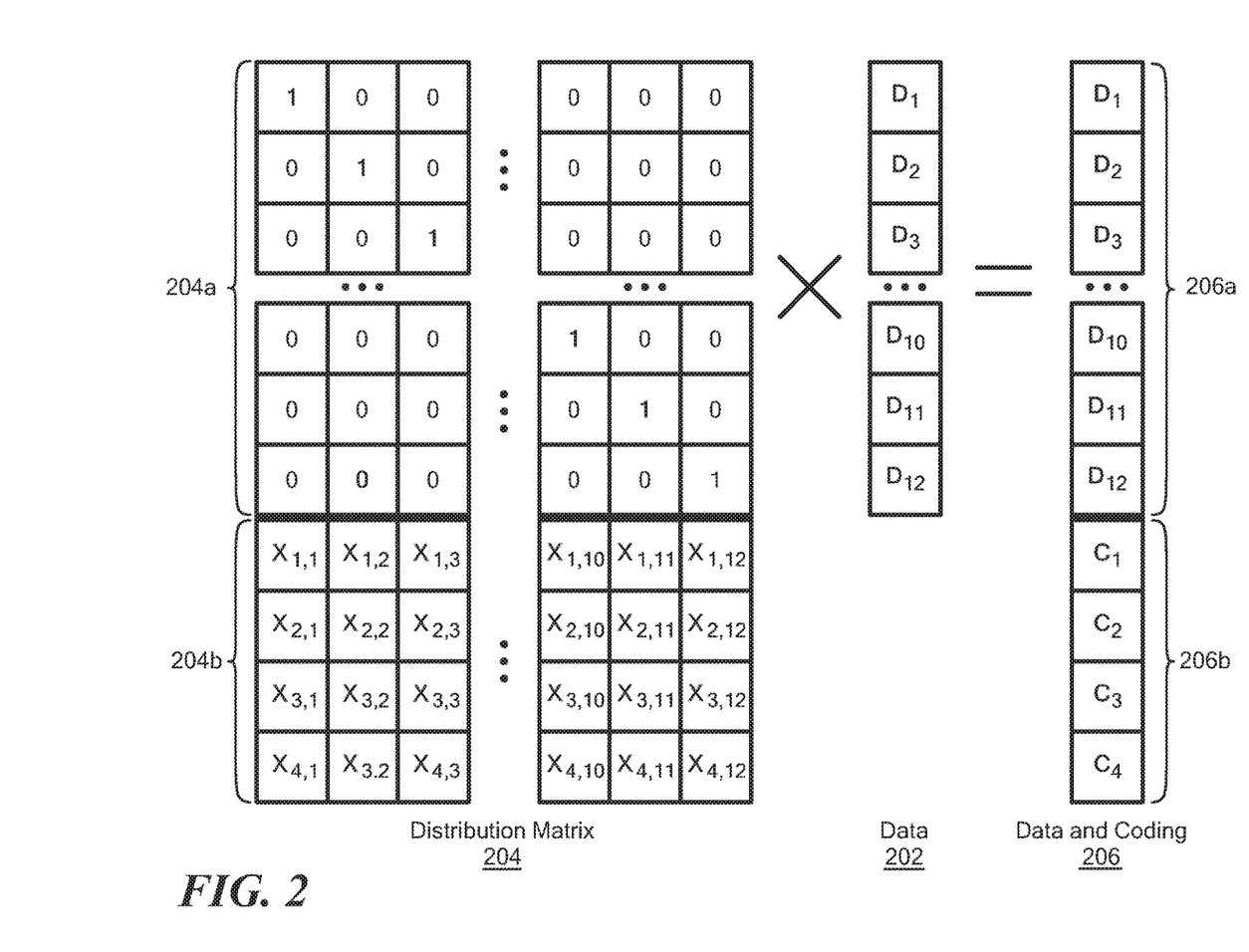
FIG. 2 is a diagram of an illustrative erasure coding technique that may be used within a distributed storage system, in accordance with an embodiment of the disclosure.

Referring to FIG. 2, a distributed storage system may use erasure coding for data protection. Arbitrary data D may be divided into k fragments $D_1, D_2, \ldots, D_k$, which can be arranged as a column vector 202. All k fragments have equal size, with padding or other data complement being added as needed as needed. The data column vector 202 can be multiplied with a distribution matrix 204 to generate m coded fragments $C_1, C_2, \ldots, C_m$. The coded fragments are considered to be "redundant" because they encode information that can be used to restore data fragments. In some embodiments, k is chosen to be twelve (12) and m is chosen to be four (4).

The distribution matrix 204 may be a (k+m)×k matrix comprising a first sub-matrix 204a having k rows and a second sub-matrix (referred to as the "coding matrix") 204b having m rows. The first sub-matrix 204a may be an identity matrix, as shown. In this form, the distribution matrix 204 can be multiplied by a data column vector 202 to result in a data-and-coding column vector 206 comprising the k data fragments 206a and the m coded fragments 206b.

The coding matrix 204b includes coefficients $X_{i,j}$ which may be selected using known erasure coding techniques. In some embodiments, the coding coefficients are selected such that the system can tolerate the loss of any m fragments. The coefficients $X_{i,j}$ may be selected based upon a specific erasure coding algorithm used.

It will be appreciated that the encoding process can be performed as m independent dot products using individual rows from the coding matrix 204b and the data column vector 202. In particular, the $i^{th}$ coded fragment $C_1$ can be calculated as the dot product of the $i^{th}$ row of the coding matrix 204b with the data column vector 202.

The data fragments $D_1, D_2 \ldots, D_k$ and coded fragments $C_1, C_2, \ldots, C_m$ may be distributed among the cluster storage nodes 106 (FIG. 1). The specific distribution of fragments to nodes (referred to as the "data layout") can be selected using a various criteria. For example, in some applications, the goal may be to store exactly one fragment per storage node 106.

If a data fragment $D_1, D_2 \ldots, D_k$ is lost (e.g., due to a node failure, a storage device failure, or data corruption), the lost fragment may be regenerated using a decoding matrix (not shown), available data fragments from $D_1, D_2, \ldots, D_k$, and coded fragments $C_1, C_2, \ldots, C_m$. The decoding matrix can be constructed as an inverse of modified distribution matrix 204 using known techniques (which may take into account which data fragments were lost). At least k unique available fragments (either data fragments or coded fragments) may be required to decode a lost data fragment.

The erasure coding technique described above may be classified as matrix-based Reed-Solomon erasure coding. In some embodiments, the distributed storage system 100 performs erasure coding over a Galois Field (GF), which defines the arithmetic operations used by erasure coding (e.g., additional and multiplication). The GF also defines the set of elements from which the coding matrix 204b coefficients $X_{i,j}$ are selected.

In various embodiments, the distributed storage system performs erasure coding over $GF(2^w)$, meaning a GF having $2^w$ elements. Typical values for w may include 4, 8, 16, and 32. Advantageously, when $GF(2^w)$ is used, the addition operation can be implemented using XOR (i.e., the exclusive OR binary operator). There is need for more efficient implementations of a multiplication operation in $GF(2^w)$ that do not depend on a specific processor instruction set.

Figure 3:
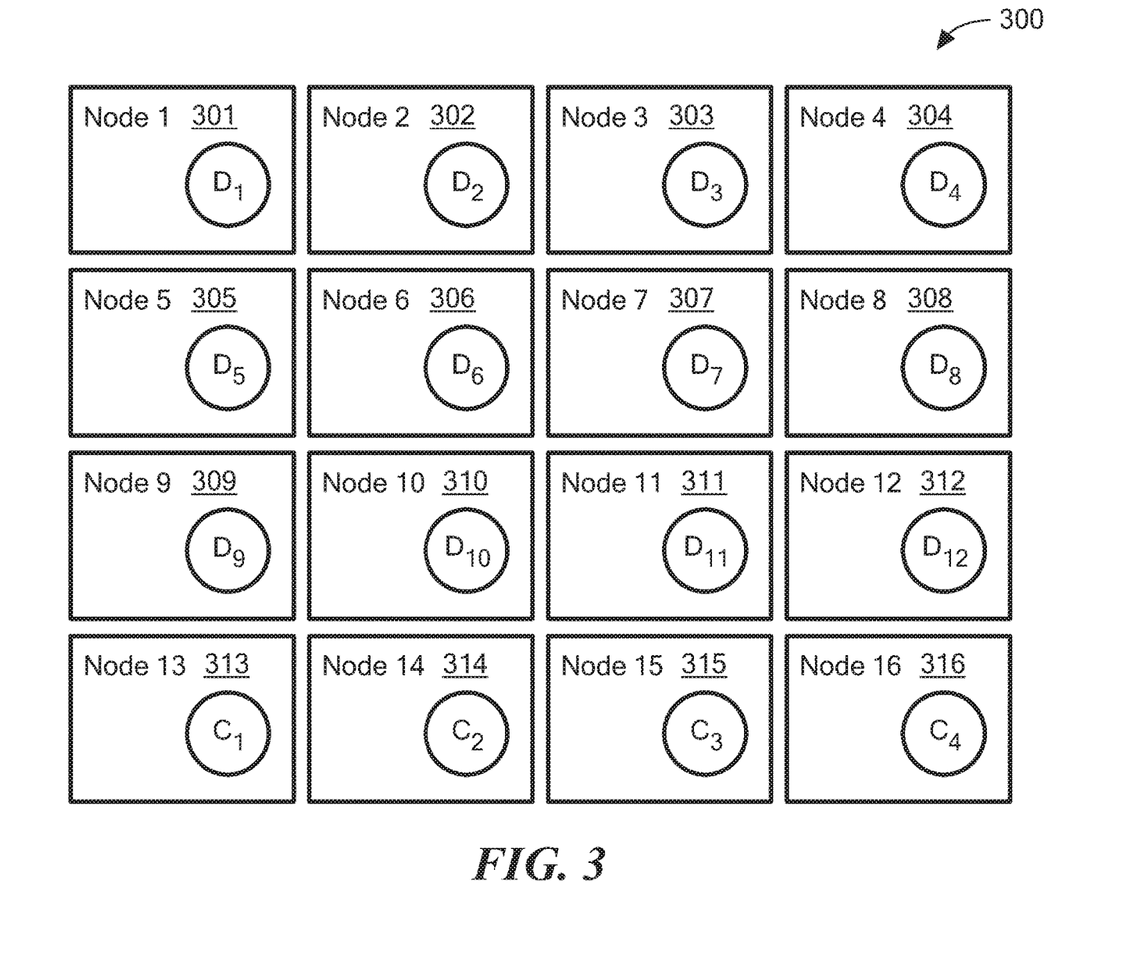
FIG. 3 is a diagram of an illustrative data layout that may be used within a distributed storage system, in accordance with an embodiment of the disclosure.

FIG. 3 shows an illustrative layout of data fragments and coded fragments within a distributed storage system 300, according to an embodiment of the disclosure. The illustrative distributed storage system 300 includes a plurality of nodes 301-316, with sixteen (16) nodes shown in this example. Any node 301-316 may be the same or similar to the node 106' of FIG. 1A.

When new data D is added to the system (e.g., via a client 102 request), the system 300 divides the data into k fragments $D_1, D_2, \ldots, D_k$, generates m coded fragments $C_1, C_2, \ldots, C_m$ therefrom, and stores the data fragments and the coded fragments across various nodes 301-316. In this example, the twelve data fragments $D_2, \ldots, D_{12a}$ are stored evenly across nodes 301-312 (i.e., one fragment per node) and four coded fragments $C_1, C_2, C_3$, and $C_4$ are stored evenly across nodes 313-316, as shown.

Depending on the number of fragments generated and the number of nodes within a cluster, a given node 301-316 could store multiple data and/or coded fragments. Conversely, a given node 301-316 may not store any data or coded fragments.

Figure 4:
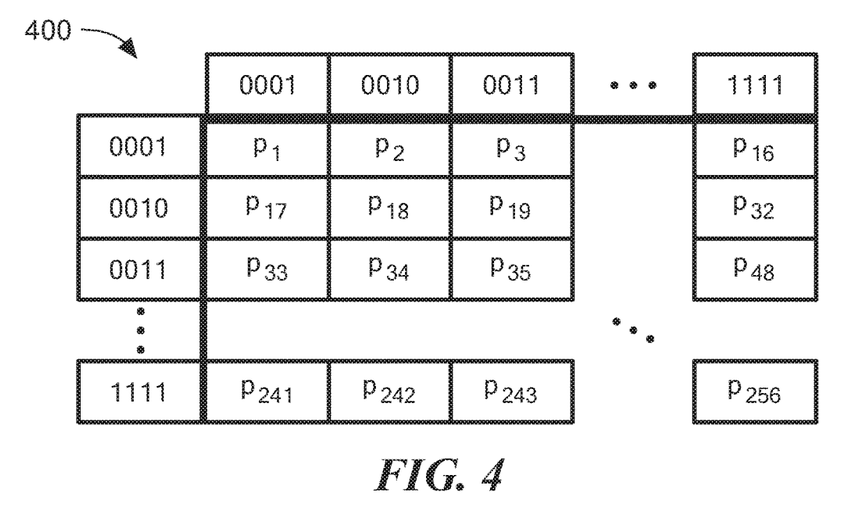
FIGS. 4, 4A, and 4B are diagrams illustrating a technique which may be used within a distributed storage system, in accordance with an embodiment of the disclosure.

Referring FIG. 4, according to some embodiments of the disclosure, a distributed storage system uses erasure coding over $GF(2^4)$. Thus, encoding (and decoding) may be performed over 4-bit elements drawn from a field of sixteen (16) possible elements. To efficiently calculate the product of two elements from the field, a 16×16 multiplication matrix 400 to be pre-computed and used as a lookup table: a first 4-bit element is used to select a row, a second 4-bit element is used to select a column, and the corresponding matrix cell contains their 4-bit product (denoted $p_i \ldots p_{256}$ in the figure) as defined by the GF. The 16×16 multiplication matrix 400 is referred to herein as a "single-element multiplication matrix" because it specifies the product of two 4-bit values, i.e., two single elements from $GF(2^4)$.

Figure 4A:
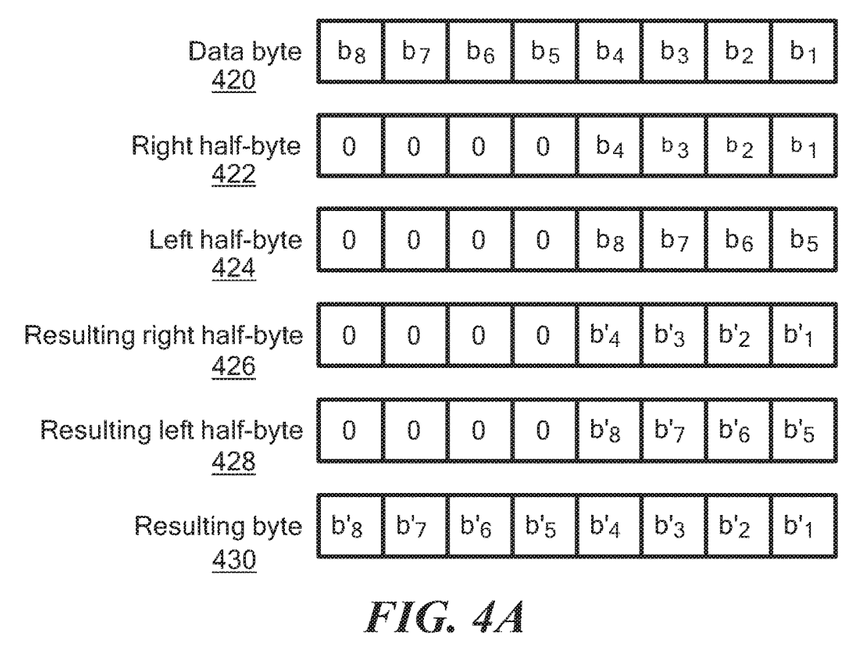

Referring to FIG. 4A, one challenge to encoding in $GF(2^4)$ is that the smallest unit of data that can be addressed in many computer systems is eight (8) bits (a byte). Thus, for example, the data fragments 202 of FIG. 2 may each be provided as an array of bytes. To make use of a single-element multiplication matrix 400, it may be necessary to split each 8-bit data value into two 4-bit values. An example procedure is illustrated in FIG. 4A, where a data byte 420 contains eight (8) bits $b_1 \ldots b_8$ is split into a right half-byte 422 containing four (4) bits $b_1 \ldots b_4$ and a left half-byte 424 containing four (4) bits $b_5 \ldots b_8$. As shown, the half-bytes 422, 424 may be stored as bytes, wherein the four highest bits are set to zero.

The right and left half-bytes 422, 424 may be calculated as follows:

Right half-byte=Data byte & 00001111  (1)

Left half-byte=(Data byte & 11110000)>>4  (2)

where & is the bitwise AND operation and >> is the bitwise right shift operation.

The two half-byte values 422, 424 can then be multiplied separately by elements in $GF(2^4)$—such as coefficients $X_{i,j}$ from an erasure coding matrix 204b (FIG. 2)—to obtain resulting half-bytes 426, 428. More precisely, each half-byte value 422, 424 may be used as a lookup into the 16×16 single-element multiplication matrix 400, as follows:

Resulting right half-byte=MultMatrix[$X_n$][Right half-byte]  (3)

Resulting left half-byte=MultMatrix[$X_n$][Left half-byte]  (4)

where $X_n$ represent elements of $GF(2^4)$, such as erasure coding coefficients $X_{i,j}$, and "MultMatrix" represents the 16×16 multiplication matrix 400. The multiplication matrix 400 can be implemented as a two-dimension array or other suitable data structure.

Referring back to FIG. 2, it will appreciated that when computing the dot product of the data column vector 202 and rows of the coding matrix 204b, both 4-bit values within each byte of data 200 are multiplied by the same coefficient $X_{i,j}$ (assuming that the size of data fragments $D_1, D_2$, etc. is a multiple of bytes). Hence, for every byte of data, the same coefficient $X_n$ may be to multiplied by both the right and left half-bytes, as shown in equations (3) and (4).

The two resulting half-bytes can then be combined back a single byte of data, as follows:

Resulting byte=(Resulting left half-byte<<4)
^ Resulting right half-byte  (5)

where ^ is the bitwise XOR operation and << is the bitwise shift left.

Figure 4B:
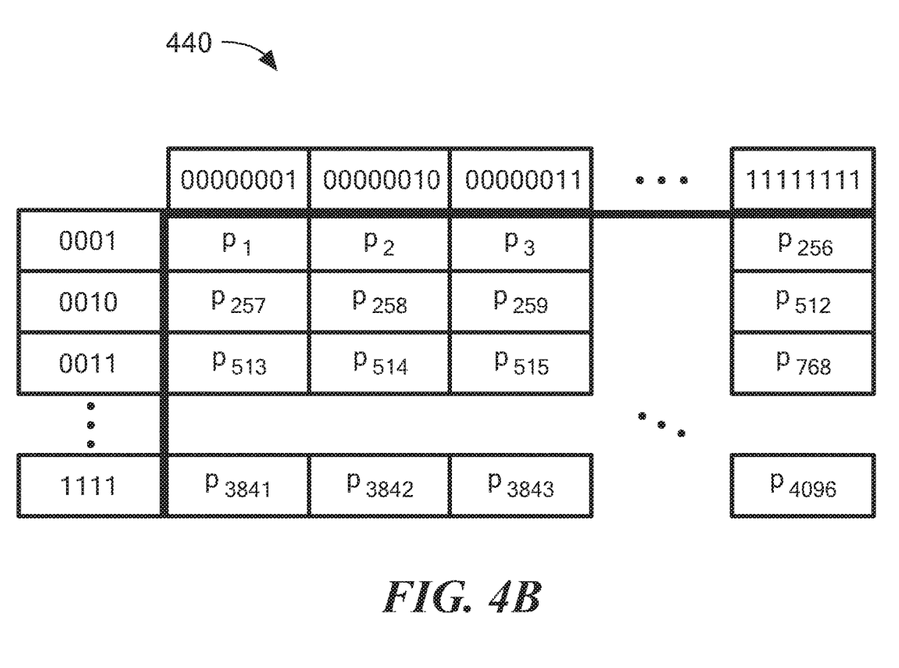

Referring to FIG. 4B, it is recognized herein it would be desirable to calculate the product of two $GF(2^4)$ elements without performing multiple bitwise operations as required by equations (1)-(5) above. According to some embodiments of the disclosure, a 16×256 multiplication matrix 440 is used to calculate products in $GF(2^4)$ without requiring bitwise manipulation. The 16×256 multiplication matrix 440 is referred to herein as a "multi-element multiplication matrix" because it specifies the product of a 4-bit value with an 8-bit value, wherein the 8-bit value represents two elements in $GF(2^4)$.

The multi-element multiplication matrix 440 can be computed directly from the single-element multiplication matrix 400. An illustrative routine for pre-computing the multi-element multiplication matrix 440 is shown in TABLE 1, where ^ is the bitwise XOR operation, "MultipleEltMatrix" is multiple-element multiplication matrix 440, and "SingleEltMatrix" is the single-element multiplication matrix 400. It should be understood that although the implementation shown involves bitwise operations, these operations can be performed prior to encoding (i.e., the multi-element multiplication matrix 440 can be pre-computed "offline").

TABLE 1

```
for ( I in [0 : 16] )
{
    for ( J in [0 : 255] )
    {
        L = (J & 11110000) >> 4;
        R = J & 00001111;
        MultipleEltMatrix[I][J] =
            (SingleEltMatrix[I][L] << 4) ^ MultipleEltMatrix [I][R]
    }
}
```

Using the multiple-element multiplication matrix 440, the resulting byte 430 from FIG. 4A can be calculated in a single step:

$$\text{Resulting byte} = \text{MultipleEltMatrix}[X_n][\text{Data byte}] \quad (6)$$

where $X_n$ represent an element in $GF(2^4)$ as described above in conjunction with equations (3) and (4).

In various embodiments, the multiple-element multiplication matrix 440 is pre-computed offline (i.e., prior to commencing erasure encoding) and stored in memory (volatile and/or non-volatile) and used to accelerate multiplication operations required during subsequent encoding operations. In real world applications the techniques may improve elapsed encoding time by a factor of two compared to existing implementations. The described techniques are not specific to any particular processor instruction set.

The multiplication acceleration technique described above can be applied to units of data larger than 1 byte, such as 2-byte values or even 4-byte values. The dimensions of the multi-element multiplication matrix 440 would be modified accordingly. For example, using 2-byte data values, the multi-element multiplication matrix 440 becomes a 16×65536 matrix. Thus, the memory required to store the multiplication matrix might be a limiting factor.

Figure 5:
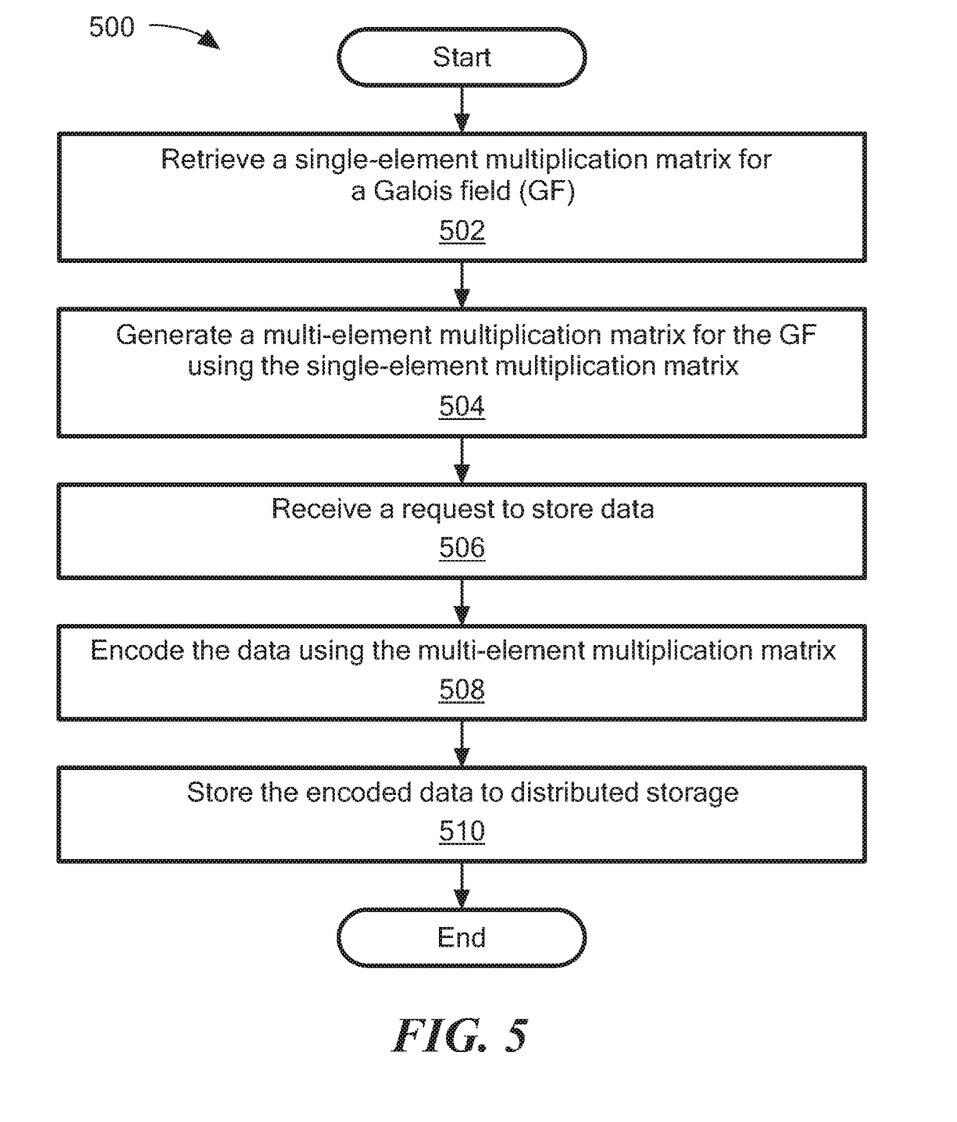
FIG. 5 is a flow diagram showing an illustrative process that may be used within the distributed storage system of FIG. 1, in accordance with an embodiment of the disclosure.

FIG. 5 is a flow diagram showing illustrative processing that can be implemented within one or more storage nodes 106 of a storage cluster 104 (FIG. 1), according to an embodiment of the disclosure. Rectangular elements (typified by element 502) herein denoted "processing blocks," represent computer software instructions or groups of instructions. Alternatively, the processing blocks may represent steps performed by functionally equivalent circuits such as a digital signal processor circuit or an application specific integrated circuit (ASIC). The flow diagram does not depict the syntax of any particular programming language. Rather, the diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the concepts, structures, and techniques sought to be protected herein. Thus, unless otherwise stated the blocks described below are unordered meaning that, when possible, the functions represented by the blocks can be performed in any convenient or desirable order.

Referring to FIG. 5 an illustrative process 500 begins at block 502, where a single-element multiplication matrix 400 is retrieved for a given Galois field (GF). The single-element multiplication matrix 400 (FIG. 4) may be retrieved from memory. In some embodiments, the matrix is hardcoded. At block 504, a multi-element multiplication matrix 440 (FIG. 4B) is generated using the single-element multiplication matrix 400. In some embodiments, block 504 involves using a routine similar to that shown in TABLE 1. In various embodiments, the GF is $GF(2^4)$, the single-element multiplication matrix 400 is a 16×16 matrix, and the a multi-element multiplication matrix 440 is a 16×256 matrix.

Once generated, the multi-element multiplication matrix 440 can be used to encode and decode data. In the example method of FIG. 5, the multi-element multiplication matrix 440 is used to encode data.

At block 506, a request to store new data may be received by a client (e.g., a user application). At block 508, the data may be encoded using multi-element multiplication matrix 440. For example, referring to the erasure coding example of FIG. 2, the received data 202 may be divided into a plurality of data fragments $D_1, D_2, \ldots, D_k$ and multiplied by a coding matrix 204b to generate coded fragments $C_1, C_2, \ldots, C_m$ 206b. Each of the data fragments $D_1, D_2, \ldots, D_k$ may be provided as an array of bytes, whereas the coefficient $X_{i,j}$ of the coding matrix 204 may be defined as 4-bit values. Thus, dot product of the data column vector 202 and rows of the coding matrix 204 can be determined, in part, using a 16×256 multi-element multiplication matrix 440.

At block 510, the encoded data may be stored across one or more nodes 106 of the cluster 104 (FIG. 1). In some embodiments, coded fragments $C_1, C_2, \ldots, C_m$ are stored across multiple nodes 106.

Figure 6:
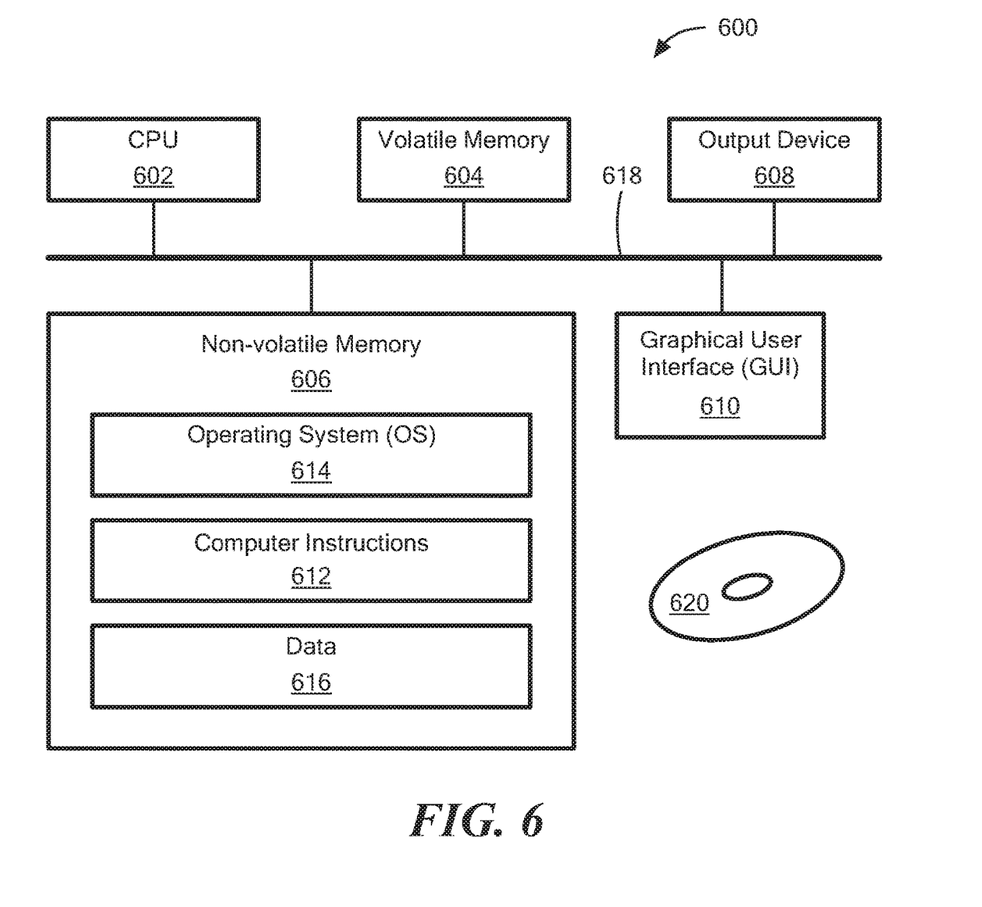
FIG. 6 is a schematic representation of an illustrative computer for use with the systems of FIGS. 1 and 1A, in accordance with an embodiment of the disclosure.

FIG. 6 shows an illustrative computer or other processing device 600 that can perform at least part of the processing described herein, in accordance with an embodiment of the disclosure. The computer 600 includes a processor 602, a volatile memory 604, a non-volatile memory 606 (e.g., hard disk), an output device 608 and a graphical user interface (GUI) 610 (e.g., a mouse, a keyboard, a display, for example), each of which is coupled together by a bus 618. The non-volatile memory 606 stores computer instructions 612, an operating system 614, and data 616. In one example, the computer instructions 612 are executed by the processor 602 out of volatile memory 604. In one embodiment, an article 620 comprises non-transitory computer-readable instructions.

Processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A method for use with a distributed storage system having a plurality of storage nodes each having locally attached storage devices, the method comprising:
    retrieving a single-element multiplication matrix for a Galois field (GF);
    generating, by the distributed storage system, a multi-element multiplication matrix for the GF using the single-element multiplication matrix;
    receiving, at the distributed storage system, a request to store data;
    erasure-coding the data to produce a plurality of data fragments and a plurality of coded fragments, the erasure-coding being performed by at least one processor in the distributed storage system based on the multi-element multiplication matrix, the erasure-coding being performed by using one or more XOR-based addition operations;
    storing the plurality of data fragments within local storage devices of at least two of the plurality of storage nodes; and
    storing the plurality of coded fragments within local storage devices of at least two of the plurality of storage nodes.

2. The method of claim 1 wherein the Galois field includes $2^4$ elements and the single-element multiplication matrix is a 16×16 matrix.

3. The method of claim 2 wherein the multi-element multiplication matrix is a 16×256 matrix.

4. The method of claim 1, wherein erasure-coding the data includes:
    dividing the data into the plurality of data fragments arranged as a column vector;
    retrieving a coding matrix having elements in the Galois field; and
    calculating the dot product of ones of the data fragments and rows of the coding matrix using the multi-element multiplication matrix to generate the plurality of coded fragments.

5. The method of claim 1 further comprising storing the multi-element multiplication matrix to non-volatile memory.

6. The method according to claim 1, further including generating the multi-element multiplication matrix for the GF using the single-element multiplication matrix prior to encoding data.

7. A storage system, comprising:
    a plurality of storage nodes each having locally attached storage devices; and
    a processor configured to:
        retrieve a single-element multiplication matrix for a Galois field (GF);
        generate a multi-element multiplication matrix for the GF using the single-element multiplication matrix;
        receive a request to store data;
        erasure-code the data to produce a plurality of data fragments and a plurality of coded fragments, the erasure coding being performed by using the multi-element multiplication matrix, the erasure coding being performed by using one or more XOR-based addition operations;
        store the plurality of data fragments within local storage devices of at least two of the plurality of storage nodes; and
        store the plurality of coded fragments within local storage devices of at least two of the plurality of storage nodes.

8. The storage system of claim 7 wherein the Galois field includes $2^4$ elements and the single-element multiplication matrix is a 16×16 matrix.

9. The storage system of claim 8 wherein the multi-element multiplication matrix is a 16×256 matrix.

10. The storage system of claim 7 wherein erasure-coding the data includes
    divide the data into the plurality of data fragments arranged as a column vector;
    retrieve a coding matrix having elements in the Galois field; and
    calculate the dot product of ones of the data fragments and rows of the coding matrix using the multi-element multiplication matrix to generate plurality of coded fragments.

11. The storage system of claim 7 further comprising a non-volatile memory, wherein the processor is further configured to store the multi-element multiplication matrix to the non-volatile memory.

12. The storage system according to claim 7, wherein the multi-element multiplication matrix for the GF is generated using the single-element multiplication matrix prior to encoding data.

* * * * *